United States Patent
Yamamoto et al.

(10) Patent No.: US 7,733,472 B2
(45) Date of Patent: Jun. 8, 2010

(54) METHOD AND SYSTEM FOR DETERMINING CONDITION OF PROCESS PERFORMED FOR COATING FILM BEFORE IMMERSION LIGHT EXPOSURE

(75) Inventors: Taro Yamamoto, Koshi (JP); Hitoshi Kosugi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 392 days.

(21) Appl. No.: 11/832,188

(22) Filed: Aug. 1, 2007

(65) Prior Publication Data

US 2008/0037013 A1    Feb. 14, 2008

(30) Foreign Application Priority Data

Aug. 11, 2006   (JP)   ............... 2006-219722

(51) Int. Cl.
*G01N 21/00*   (2006.01)

(52) U.S. Cl. ............... 356/237.2; 356/237.4; 356/237.5

(58) Field of Classification Search ... 356/237.1–237.6, 356/625–637; 156/145.1, 348, 349; 264/129, 264/131–132, 211, 157, 171.1–174.1
See application file for complete search history.

(56) References Cited

U.S. PATENT DOCUMENTS

| | | | | |
|---|---|---|---|---|
| 5,891,348 A | * | 4/1999 | Ye et al. | ......... 216/67 |
| 6,005,978 A | * | 12/1999 | Garakani | ......... 382/218 |
| 2006/0231206 A1 | | 10/2006 | Nagasaka et al. | |

* cited by examiner

*Primary Examiner*—Gregory J Toatley, Jr.
*Assistant Examiner*—Tri T Ton
(74) *Attorney, Agent, or Firm*—Oblon, Spivak, McClelland, Maier & Neustadt, L.L.P.

(57) ABSTRACT

A method is used for determining a condition of a predetermined process for preparing a process target, which includes a coating film formed on a substrate and including a resist film. This is to prevent film peeling from occurring in the coating film when performing immersion light exposure after the predetermined process. The method includes preparing test targets, each of which includes a sample film corresponding to the coating film and formed on a sample substrate corresponding to the substrate; performing a test process on each of the test targets in a testing unit, which imitates an immersion light exposure apparatus, under a condition corresponding to a designated immersion light exposure condition; and determining a condition of the predetermined process to be used for the coating film, based on a result of the test process.

9 Claims, 12 Drawing Sheets

METHOD AND SYSTEM FOR DETERMINING CONDITION OF PROCESS PERFORMED FOR COATING FILM BEFORE IMMERSION LIGHT EXPOSURE

BACKGROUND OF THE INVENTION

1. Field of the Invention

The present invention relates to a process condition determining method for determining a condition of a predetermined process for preparing a process target, which comprises a coating film, so as to prevent film peeling from occurring in the coating film when performing immersion light exposure after the predetermined process. The present invention also relates to a process condition determining system and a computer readable storage medium that stores a control program both for executing the process condition determining method.

2. Description of the Related Art

In the process of manufacturing semiconductor devices, photolithography techniques are used for forming circuit patterns on semiconductor wafers. Where a circuit pattern is formed by use of photolithography, the process steps are performed, as follows. Specifically, a resist liquid is first applied to a semiconductor wafer to form a resist film. Then, the resist film is irradiated with light to perform light exposure on the resist film in accordance with the circuit pattern. Then, the resist film is subjected to a developing process.

In recent years, the integration degree of semiconductor devices becomes increasingly higher to improve the operation speed and so forth. Accordingly, photolithography techniques are required to increase the miniaturization level of circuit patterns formed on semiconductor wafers. As a photolithography technique for realizing a high resolution of a 45-nm node level, there has been proposed the following immersion light exposure (for example, see U.S. Patent Application Publication No. US 2006/0231206 A1). In this immersion light exposure, a light exposure liquid, such as purified water, having a refractive index higher than air is supplied between the semiconductor wafer and light exposure projection lens. The wavelength of light radiated from the projection lens is shortened by means of the refractive index of the light exposure liquid, so that the line width obtained by the light exposure is decreased.

In an immersion light exposure process of this kind, in order to prevent a light exposure liquid from infiltrating a resist film or to prevent a resist component from liquating out in a light exposure liquid, a protection film (top coating film) is formed on the resist film in many cases. In such cases, a three-layer structure comprising an anti-reflective coating (BARC), the resist film, and the top coating film is formed on a wafer. On the other hand, the immersion light exposure process is performed, while forming a liquid flow by supply and suction of a liquid, and forming an air curtain as needed. Consequently, if the edge portion of the film has not been suitably processed, the film may cause film peeling on the wafer due to the liquid flow and/or the gas flow of the air curtain.

Where film peeling occurs, peeled films turn into particles, which contaminate a light exposure machine (lens) and/or induce development faults.

In order to prevent a film formed on a wafer from peeling, thereby solving the problem described above, it is effective to optimize conditions of a process performed on the film, such as an edge process or adhesion process. However, there are various film materials and film structures, while light exposure machine makers adopt different conditions for liquid flows and so forth used in immersion light exposure machines. Accordingly, it is unclear whether or not film peeling occurs in immersion light exposure, until the film is actually processed in an immersion light exposure machine, and thus it is difficult to prepare for film peeling in advance.

BRIEF SUMMARY OF THE INVENTION

An object of the present invention is to provide a process condition determining method for determining a condition of a predetermined process for preparing a process target, which comprises a coating film, so as to prevent film peeling from occurring in the coating film when performing immersion light exposure after the predetermined process. Another object of the present invention is to provide a process condition determining system and a computer readable storage medium that stores a control program both for executing the process condition determining method.

According to a first aspect of the present invention, there is provided a process condition determining method for determining a condition of a predetermined process for preparing a process target, which comprises a substrate and a coating film formed on the substrate and including a resist film, so as to prevent film peeling from occurring in the coating film on the substrate when performing immersion light exposure, which performs light exposure on the resist film in accordance with a predetermined pattern while immersing the coating film in a liquid, after the predetermined process, the method comprising: preparing test targets, each of which comprises a sample substrate corresponding to the substrate and a sample film corresponding to the coating film and formed on the sample substrate; performing a test process on each of the test targets in a testing unit, which imitates an immersion light exposure apparatus, under a condition corresponding to a designated immersion light exposure condition; and determining a condition of the predetermined process to be used for the coating film, based on a result of the test process.

In the first aspect, each of the coating film and the sample film may comprise an anti-reflective coating, a resist film, and a protection film laminated in this order from below. Said determining a condition of the predetermined process may comprise examining a state of the sample film by an examination unit after the test process. The examination unit may be configured to examine a state of the sample film by an optical method. The predetermined process may be a process concerning the coating film performed on or after formation of the coating film and before the immersion light exposure. The predetermined process may be an edge process performed on an edge portion of the coating film. The condition corresponding to the designated immersion light exposure condition may be selected from a database comprising a library containing various conditions.

According to a second aspect of the present invention, there is provided a process condition determining method for determining a condition of an edge process performed on an edge portion of a coating film formed in a process target, the method comprising: preparing a test target, which comprises a sample film corresponding to the coating film subjected to the edge process under a certain condition; performing a test process on the test target in a testing unit, which imitates an immersion light exposure apparatus, under a condition corresponding to a designated immersion light exposure condition; performing examination on a state of an edge portion of the sample film after the test process; performing judgment as to whether or not the state of the edge portion of the sample film is within an allowable range, based on a result of the examination; in response to a case where the state of the edge portion of the sample film is out of the allowable range, performing the test process, the examination, and the judgment on another test target prepared by use of a different condition of the edge process; and in response to a case where the state of the edge portion of the sample film is within the allowable range, determining a condition of the edge process to be used for the process target, based on the condition of the edge process used for preparing this test target.

In the second aspect, each of the coating film and the sample film may comprise an anti-reflective coating, a resist film, and a protection film laminated in this order from below. The examination may comprise examining the state of the edge portion of the sample film by an optical method. The condition corresponding to the designated immersion light exposure condition may be selected from a database comprising a library containing various conditions.

According to a third aspect of the present invention, there is provided a process condition determining system for determining a condition of an edge process performed on an edge portion of a coating film formed in a process target, the system comprising: a testing unit configured to imitate an immersion light exposure apparatus and to perform a test process, under a condition corresponding to a designated immersion light exposure condition, on a test target, which comprises a sample film corresponding to the coating film subjected to the edge process under a certain condition; an examination unit configured to perform examination on a state of an edge portion of the sample film after the test process; and a control section configured to perform judgment as to whether or not the state of the edge portion of the sample film is within an allowable range, based on a result of the examination; in response to a case where the state of the edge portion of the sample film is out of the allowable range, performing the test process, the examination, and the judgment on another test target prepared by use of a different condition of the edge process; and in response to a case where the state of the edge portion of the sample film is within the allowable range, determining a condition of the edge process to be used for the process target, based on the condition of the edge process used for preparing this test target.

In the third aspect, the examination unit may be configured to examine a state of the sample film by an optical method. The control section may include a database comprising a library containing various immersion light exposure conditions and may be configured to select the condition corresponding to the designated immersion light exposure condition from the database.

According to a fourth aspect of the present invention, there is provided a computer readable storage medium that stores a control program for execution on a computer, the control program, when executed, causing the computer to control a system to conduct a process condition determining method for determining a condition of an edge process performed on an edge portion of a coating film formed in a process target, the method comprising: performing a test process on the test target, which comprises a sample film corresponding to the coating film subjected to the edge process under a certain condition, in a testing unit, which imitates an immersion light exposure apparatus, under a condition corresponding to a designated immersion light exposure condition; performing examination on a state of an edge portion of the sample film after the test process; performing judgment as to whether or not the state of the edge portion of the sample film is within an allowable range, based on a result of the examination; in response to a case where the state of the edge portion of the sample film is out of the allowable range, performing the test process, the examination, and the judgment on another test target prepared by use of a different condition of the edge process; and in response to a case where the state of the edge portion of the sample film is within the allowable range, determining a condition of the edge process to be used for the process target, based on the condition of the edge process used for preparing this test target.

In the fourth aspect, the condition corresponding to the designated immersion light exposure condition may be selected from a database comprising a library containing various conditions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
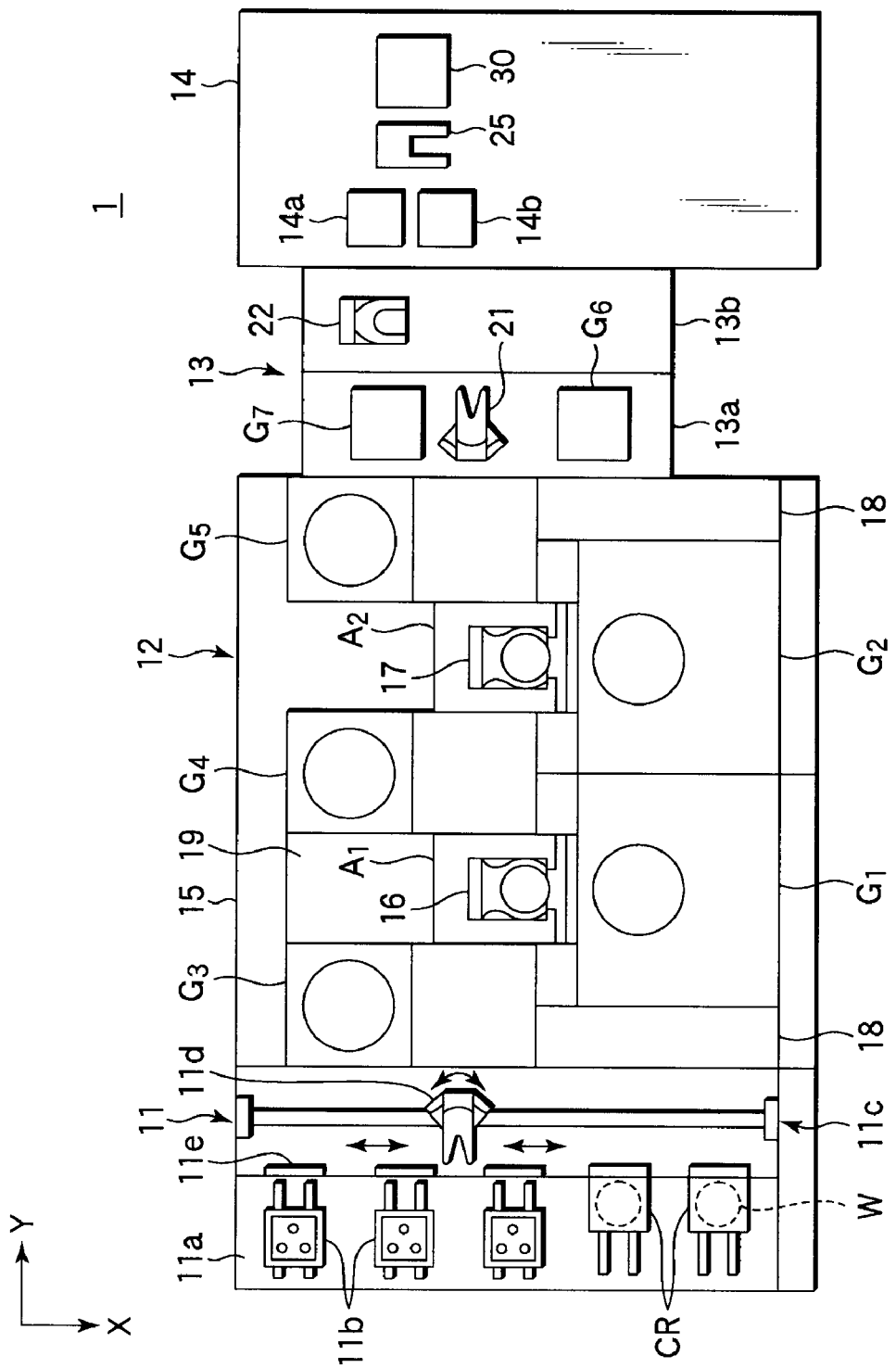
FIG. 1 is a plan view schematically showing the structure of a pattern forming apparatus, which can utilize a process condition determining method for a coating film to be subjected to immersion light exposure, according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary.

Figure 2:
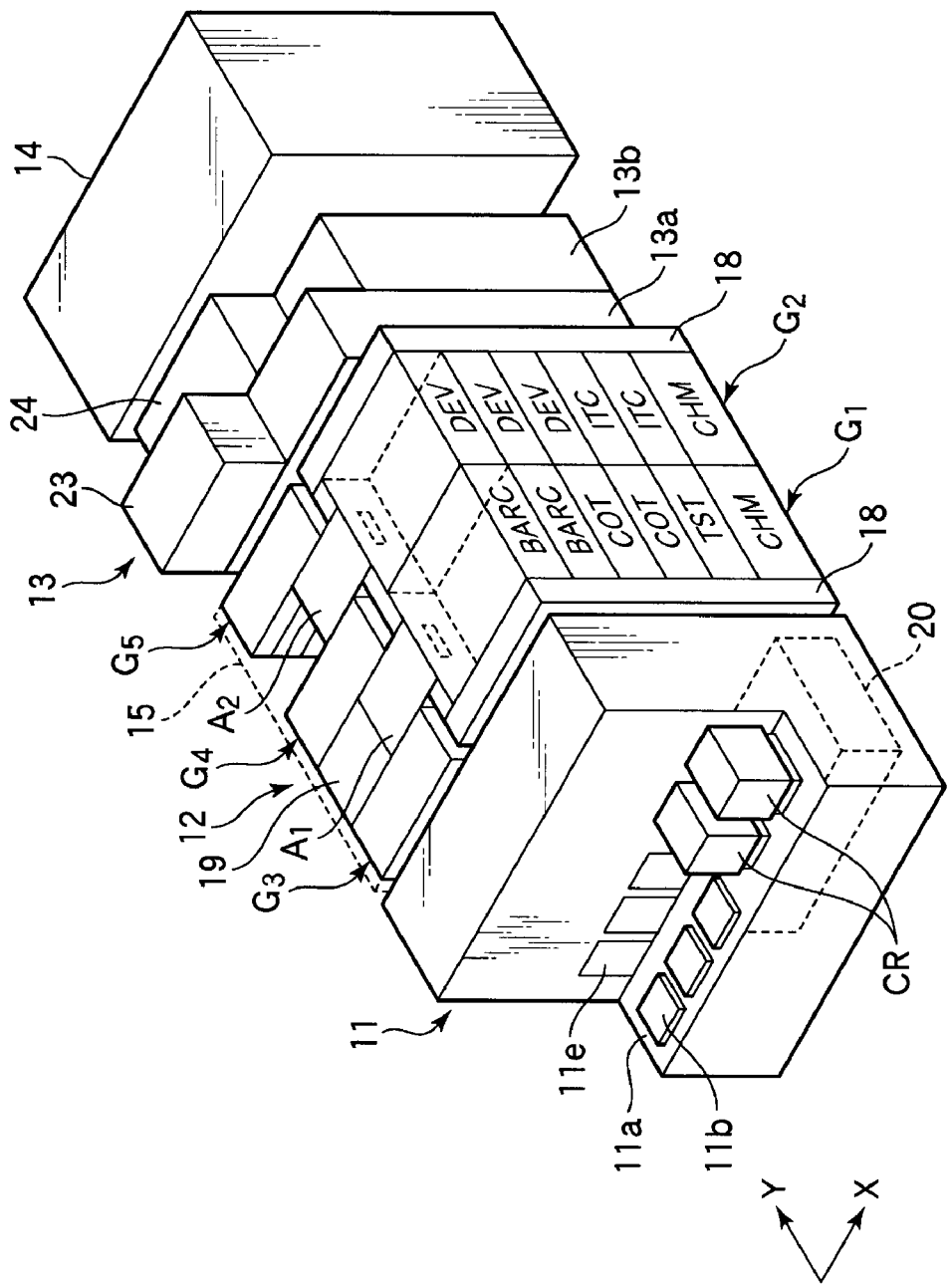
FIG. 2 is a perspective view schematically showing the pattern forming apparatus.

FIG. 1 is a plan view schematically showing a pattern forming apparatus according to an embodiment of the present invention. FIG. 2 is a perspective view schematically showing the pattern forming apparatus. The pattern forming apparatus 1 is designed to form a predetermined resist pattern on a semiconductor substrate or wafer W. This pattern forming apparatus 1 includes a cassette station 11 used as a transfer station for wafers W, a process station 12 comprising a plurality of processing units each for performing a predetermined process on a wafer W, a light exposure apparatus 14 for performing a light exposure process on a wafer W, and an interface station 13 for transferring wafers W between the process station 12 and light exposure apparatus 14. The cassette station 11, process station 12, interface station 13, and light exposure apparatus 14 are arrayed in series in this order in the longitudinal direction of the pattern forming apparatus 1 (Y-direction).

The cassette station 11 includes a cassette table 11a for placing thereon wafer cassettes (CR) each storing a plurality of, such as 13, wafers W, and a wafer transfer mechanism 11c for transferring wafers W between the wafer cassettes (CR) placed on the cassette table 11a and a transition unit located in a third processing unit group $G_3$ in the process station 12 described later. The cassette table 11a and wafer transfer mechanism 11c are arrayed in series in this order in the Y-direction. The cassette table 11a has a plurality of, e.g., five positioning portions lib each for positioning a wafer cassette (CR), arrayed thereon in the width direction of the pattern forming apparatus 1 (X-direction). A wafer cassette (CR) is placed at each of the positioning portions 20a such that its transfer port faces an opening/closing portion lie formed in a wall of the casing of the wafer transfer mechanism 11c. The wafer transfer mechanism 11c includes a transfer pick 11d disposed in the casing for handling wafers W, so that the wafers W are transferred by the transfer pick 11d between the wafer cassettes (CR) on the cassette table 11a and the transition unit.

The process station 12 is arranged in a casing 15, on the front side of which (lower side in FIG. 1), the process station 12 includes a first processing unit group $G_1$ and a second processing unit group $G_2$ arrayed in this order from the cassette station 11 toward the interface station 13. On the rear side of the casing 15 (upper side in FIG. 1), the process station 12 includes a third processing unit group $G_3$, a fourth processing unit group $G_4$, and a fifth processing unit group $G_5$ arrayed in this order from the cassette station 11 toward the interface station 13. Further, the process station 12 includes a first main transfer section $A_1$ interposed between the third processing unit group $G_3$ and fourth processing unit group $G_4$, and a second main transfer section $A_2$ interposed between the fourth processing unit group $G_4$ and fifth processing unit group $G_5$.

The first processing unit group $G_1$ includes a plurality of processing units stacked one on the other, which are formed of, e.g., two bottom coating units (BARC) for forming an anti-reflective coating that prevents reflection of light during light exposure on a wafer W, two resist coating units (COT) for forming a resist film on a wafer W, and a testing unit (TST) configured to perform tests, which imitate conditions of immersion light exposure, on test wafers (test targets). The second processing unit group $G_2$ includes a plurality of processing units stacked one on the other, which are formed of, e.g., three development units (DEV) for performing a development process on a wafer W, and two top coating units (ITC) for forming a protection film (top coating film) having water repellency on the surface of a resist film formed on a wafer W.

Each of the third processing unit group $G_3$, fourth processing unit group $G_4$, and fifth processing unit group $G_5$ includes a plurality of, such as 10, processing units stacked one on the other, which are formed of, e.g., an adhesion unit for performing a hydrophobic process on a wafer W, a pre-baking unit for performing a heating process on a wafer W after resist coating, a post-baking unit for performing a heating process on a wafer W after development, a post-exposure baking unit for performing a heating process on a wafer W after light exposure and before development, and so forth. The third processing unit group $G_3$ includes a transition unit through which wafers W are transferred between the cassette station 11 and first main transfer section $A_1$. The fifth processing unit group $G_5$ includes a transition unit through which wafers W are transferred between the second main transfer section $A_2$ and a first wafer transfer member 21 used in the interface station 13 described later.

The first main transfer section $A_1$ is provided with a first main wafer transfer arm 16 for handling wafers W, which can selectively access the units located in the first processing unit group $G_1$, third processing unit group $G_3$, and fourth processing unit group $G_4$. The second main transfer section $A_2$ is provided with a second main wafer transfer arm 17 for handling wafers W, which can selectively access the units located in the second processing unit group $G_2$, fourth processing unit group $G_4$, and fifth processing unit group $G_5$.

Temperature/humidity adjusting units 18 are respectively disposed between the first processing unit group $G_1$ and cassette station 11 and between the second processing unit group $G_2$ and interface station 13. Each of the temperature/humidity adjusting units 18 includes a temperature adjusting device for process liquids to be supplied to the first and second processing unit groups $G_1$ and $G_2$, and a duct for adjustment of temperature and humidity. Chemical unit (CHM) are respectively disposed below the first and second processing unit groups $G_1$ and $G_2$, for supplying chemical solutions to the first and second processing unit groups $G_1$ and $G_2$.

On the rear side of the first main transfer section $A_1$, an examination unit 19 is disposed to examine each of the test wafers processed by tests, which imitate conditions of immersion light exposure, in the testing unit (TST). The examination unit 19 examines the states of the anti-reflective coating, resist film, and protection film, and more specifically, whether or not film peeling has occurred.

Figure 3:
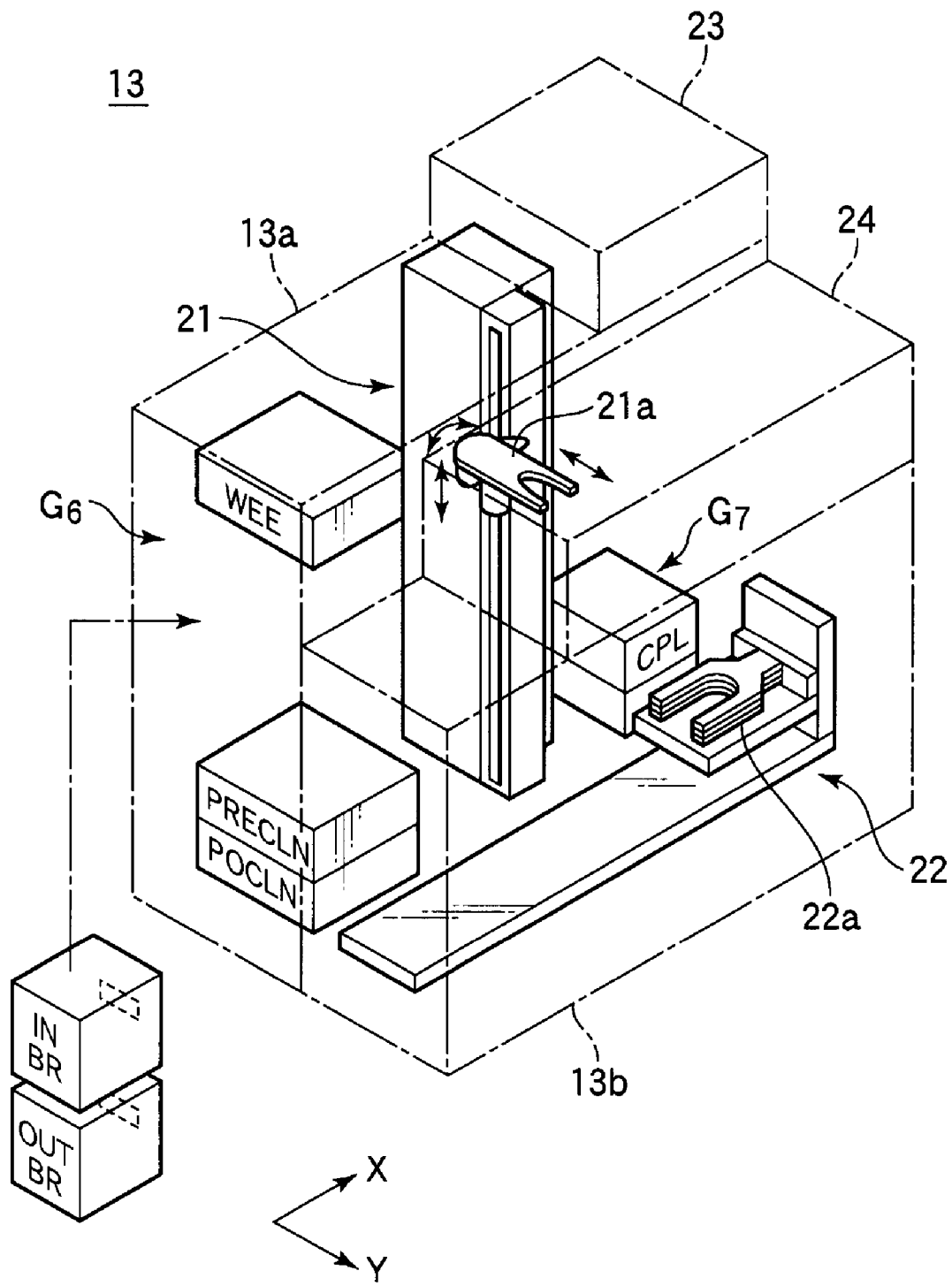
FIG. 3 is a perspective view schematically showing an interface station used in the pattern forming apparatus.

FIG. 3 is a perspective view schematically showing the interface station 13 used in the pattern forming apparatus 1. The interface station 13 has a casing that defines a first interface station 13a on the process station 12 side and a second interface station 13b on the light exposure apparatus 14 side. The first interface station 13a is provided with a first wafer transfer member 21 disposed to face an opening portion of the fifth processing unit group $G_5$ for transferring wafers W. The second interface station 13b is provided with a second wafer transfer member 22 movable in the X-direction for transferring wafers W.

A sixth processing unit group $G_6$ is located on the front side of the first interface station 13a, and includes, e.g., a periphery light exposure unit (WEE), an incoming buffer cassette (INBR), an outgoing buffer cassette (OUTBR), a pre-cleaning unit (PRECLN), and a post-cleaning unit (POCLN), stacked one on the other. The periphery light exposure unit (WEE) is used for performing light exposure selectively only on the edge portion of a wafer W to remove unnecessary resist portion near the edge of the wafer. The incoming buffer cassette (INBR) is used for temporarily placing wafers W to be transferred into the light exposure apparatus 14. The outgoing buffer cassette (OUTBR) is used for temporarily placing wafers W transferred from the light exposure apparatus 14. The pre-cleaning unit (PRECLN) is used for cleaning a wafer to be transferred into the light exposure apparatus 14. The post-cleaning unit (POCLN) is used for cleaning a wafer transferred from the light exposure apparatus 14. A seventh processing unit group $G_7$ is located on the rear side of the first interface station 13a, and includes, e.g., two high-precision temperature adjusting units (CPL), stacked one on the other, for adjusting the temperature of a wafer W with high precision.

The first wafer transfer member 21 includes a fork 21a for transferring wafers W. The fork 21a can selectively access the units located in the fifth processing unit group $G_5$, sixth processing unit group $G_6$, and seventh processing unit group $G_7$ to transfer wafers W between these units.

The second wafer transfer member 22 includes a fork 22a for transferring wafers W. The fork 22a can selectively access the pre-cleaning unit (PRECLN) and post-cleaning unit (POCLN) of the sixth processing unit group $G_6$, the units located in the seventh processing unit group $G_7$, and an incoming stage 14a and an outgoing stage 14b of the light exposure apparatus 14 described later to transfer wafers W between these portions.

A gas flow adjusting section 23 is disposed on top of the first interface station 13a to adjust the gas flow inside the first interface station 13a or interface station 13. A humidifier section 24 is disposed on top of the second interface station 13b to humidify the atmosphere inside the second interface station 13b or interface station 13 not to dry a wafer W transferred from the light exposure apparatus.

As described above, the process station 12 includes the resist coating units (COT) for applying a resist onto a wafer W to form a film, the development units (DEV) for developing a resist film after light exposure performed by the light exposure apparatus 14, and so forth. The interface station 13 includes the pre-cleaning unit (PRECLN) for cleaning a wafer W after resist coating and before light exposure, and the post-cleaning unit (POCLN) for cleaning a wafer W after light exposure and before development. Accordingly, the process station 12 and interface station 13 constitute a resist coating/developing section.

The light exposure apparatus 14 includes an incoming stage 14a for placing thereon wafers W transferred from the interface station 13, and an outgoing stage 14b for placing thereon wafers W to be transferred to the interface station 13. The light exposure apparatus 14 further includes an immersion light exposure section 30 structured to subject a resist film formed on a wafer W to light exposure while immersing the resist film in a predetermined liquid. A wafer transfer mechanism 25 is disposed to transfer wafers W between the incoming stage 14a, immersion light exposure section 30, and outgoing stage 14b.

As shown in FIG. 2, a central control section 20 is located below the cassette station 11 and is used for controlling this pattern forming apparatus 1, as a whole. The control section 20 will be explained in detail later.

Where a product wafer (process target) is processed in the pattern forming apparatus 1 arranged as described above, wafers W are taken out one by one from a wafer cassette (CR) by the transfer pick 11d of the wafer transfer mechanism 11c. A wafer W thus taken out is transferred by the transfer pick 11d into the transition unit of the third processing unit group $G_3$ of the process station 12. Then, the wafer W is sequentially transferred by the first and second main transfer sections $A_1$ and $A_2$ through predetermined units in the first to fifth processing unit groups $G_1$ to $G_5$, so that the wafer W is subjected to a series of processes in accordance with the order prescribed in the recipe. For example, the wafer W is subjected to an adhesion process in the adhesion unit, formation of an anti-reflective coating in one of the bottom coating units (BARC), formation of a resist film in one of the resist coating units (COT), formation of a protection film in one of the top coating units (ITC), and a pre-baking process in the pre-baking unit in this order. In this case, the adhesion process is performed, as needed, in accordance with the type of an edge process described later.

Thereafter, while the wafer W is transferred by the first wafer transfer member 21 in the interface station 13, the wafer W is subjected to a periphery light exposure process in the periphery light exposure unit (WEE), a pre-cleaning process in the pre-cleaning unit (PRECLN), and a drying process in the high-precision temperature adjusting unit (CPL) in this order. Then, the wafer W is transferred by the second wafer transfer member 22 to the incoming stage 14a of the light exposure apparatus 14. Then, the wafer W is transferred by the wafer transfer mechanism 25 of the light exposure apparatus 14 to the immersion light exposure section 30, in which the wafer W is subjected to an immersion light exposure process. Thereafter, the wafer W is transferred by the wafer transfer mechanism 25 to the outgoing stage 14b. Then, the wafer W is transferred by the second wafer transfer member 22 of the interface station 13 to the post-cleaning unit (POCLN), in which the wafer W is subjected to post-cleaning. Thereafter, the wafer W is transferred by the first wafer transfer member 21 to the transition unit of the fifth processing unit group Gs. Then, the wafer W is sequentially transferred by the first and second main transfer sections $A_1$ and $A_2$ through predetermined units in the first to fifth processing unit groups $G_1$ to $G_5$, so that the wafer W is subjected to a series of processes in accordance with the order prescribed in the recipe. For example, the wafer W is subjected to a post-exposure baking process in the post-exposure baking unit, a developing process in one of the development units (DEV), and a post-baking process in the post-baking unit in this order. Then, the wafer W is transferred to the transition unit of the third processing unit group $G_3$, and is further transferred to a wafer cassette (CR) placed on the cassette station 11.

In the processes for a product wafer described above, when the immersion light exposure is performed in the light exposure apparatus 14, a light exposure liquid, typically purified water, is held between the light exposure head and wafer W. In this state, the light exposure head and wafer are moved relative to each other, and, as needed, air is further blown to a portion on the wafer W near the light exposure head to form an air curtain. Accordingly, film peeling may occur in the film formed on the wafer W due to impacts caused by the actions described above.

Figure 4:
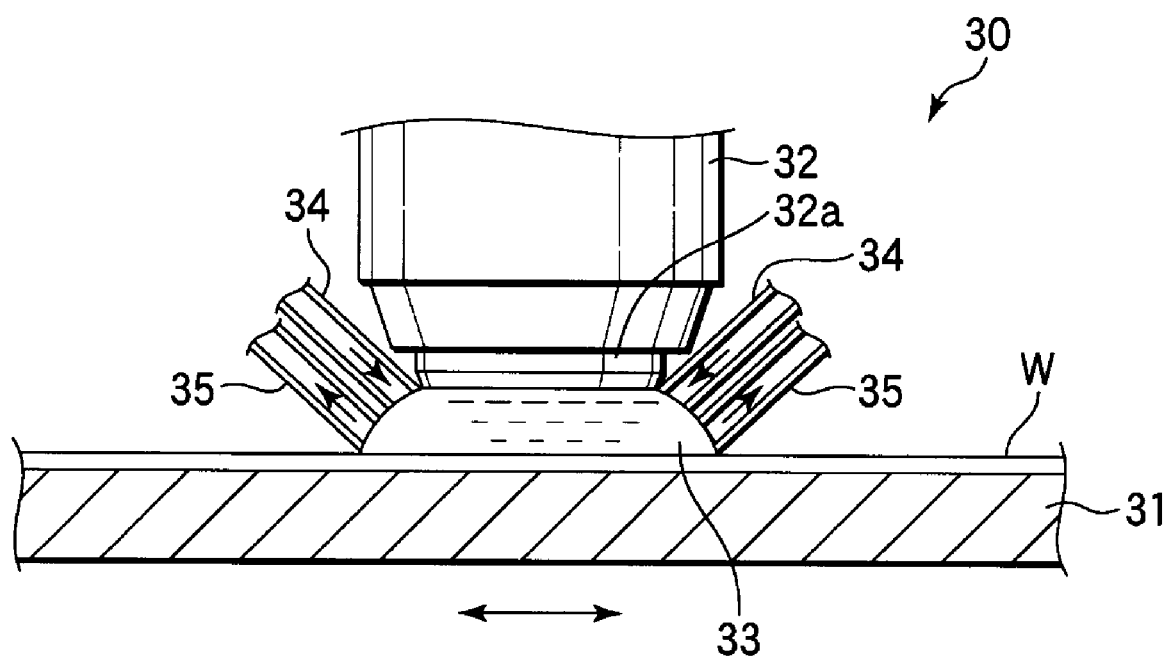
FIG. 4 is a view schematically showing an example of the immersion light exposure section of a light exposure apparatus used in the pattern forming apparatus.
Figure 5:
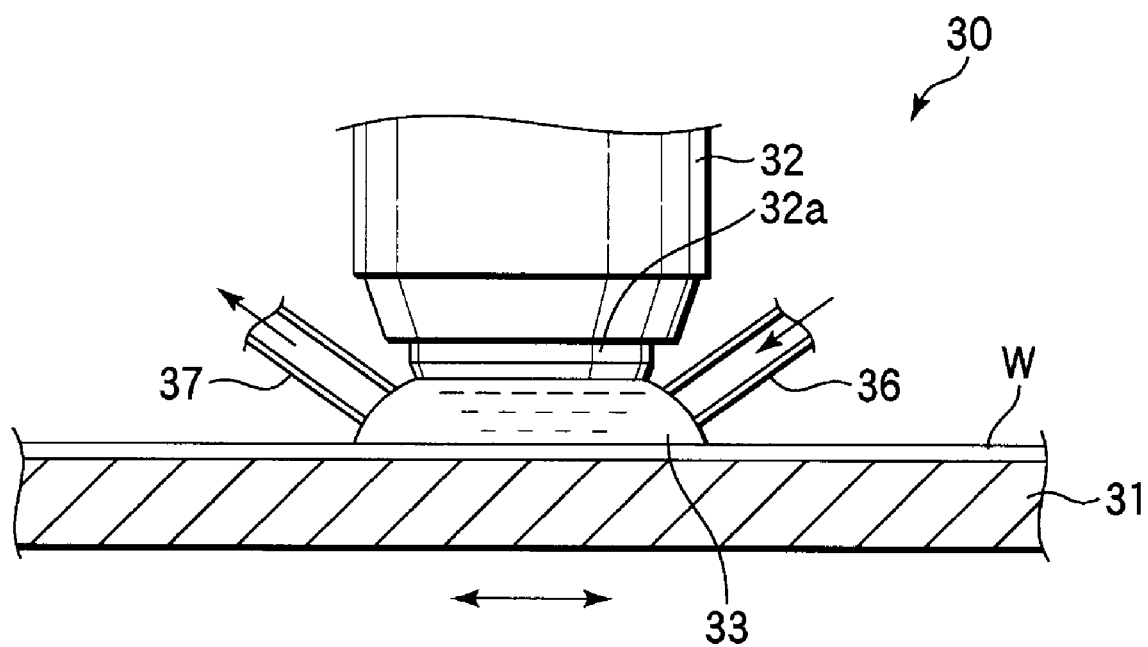
FIG. 5 is a view schematically showing another example of the immersion light exposure section of a light exposure apparatus used in the pattern forming apparatus.
Figure 6:
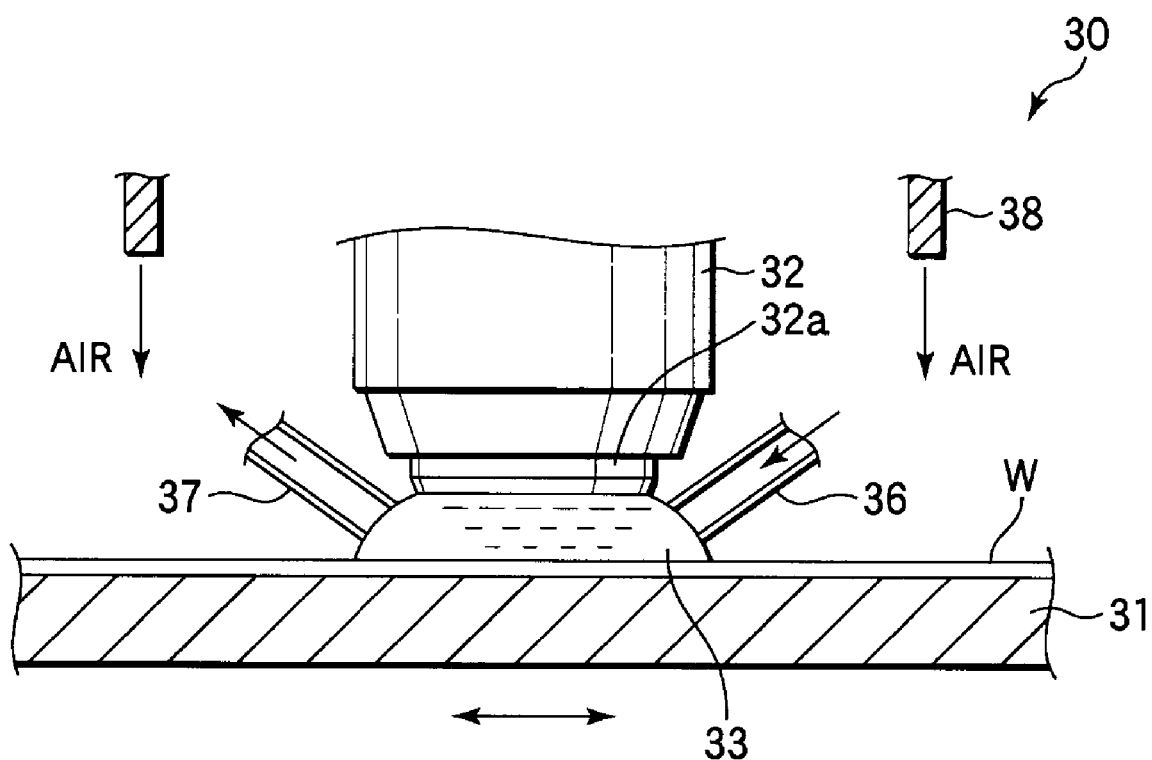
FIG. 6 is a view schematically showing another example of the immersion light exposure section of a light exposure apparatus used in the pattern forming apparatus.

FIGS. 4 to 6 are views schematically showing different examples of the immersion light exposure section 30 of the light exposure apparatus 14. In the example shown in FIG. 4, a light exposure head 32 including a projection lens is disposed above an X-Y stage 31 for placing a wafer W thereon, which is movable in the X-direction and Y-direction. The light exposure head 32 has a liquid holding portion 32a at the distal end, and a liquid pool portion 33 consisting of a light exposure liquid, such as purified water, is formed between the liquid holding portion 32a and wafer W. The liquid pool portion 33 is formed by light exposure liquid supply nozzles 34 located on both sides of the liquid holding portion 32a and light exposure liquid collection nozzles 35 located outside the light exposure liquid supply nozzles 34 on both sides of the liquid holding portion 32a. The liquid pool portion 33 of a light exposure liquid is formed while the light exposure liquid is circulated by use of the nozzles. In this state, i.e., while the liquid pool portion 33 is formed, the wafer W is moved by the X-Y stage 31. In the example shown in FIG. 5, the light exposure liquid supply nozzles 34 and light exposure liquid collection nozzles 35 shown in FIG. 4 are replaced with a light exposure liquid supply nozzle 36 and a light exposure liquid collection nozzle 37 respectively located on one side and the other side of the light exposure head 32. In the example shown in FIG. 6, the structure shown in FIG. 5 is further provided with an annular air spouting nozzle 38 to spout air to form an air curtain around the light exposure head 32.

These structures of different types apply different impacts to the edge portion of a film formed on a wafer W. Further, depending on the required throughput, the relative movement speed between the immersion light exposure section 30 and wafer W needs to be set at different values, which bring about different impacts to the film. Accordingly, film peeling occurs depending on conditions used in the immersion light exposure section 30.

According to this embodiment made in light of this fact, the testing unit (TST) described above is used to perform tests, which imitate conditions of immersion light exposure, on test wafers, so as to examine occurrence of film peeling in advance. The testing unit (TST) will be explained below.

Figure 7:
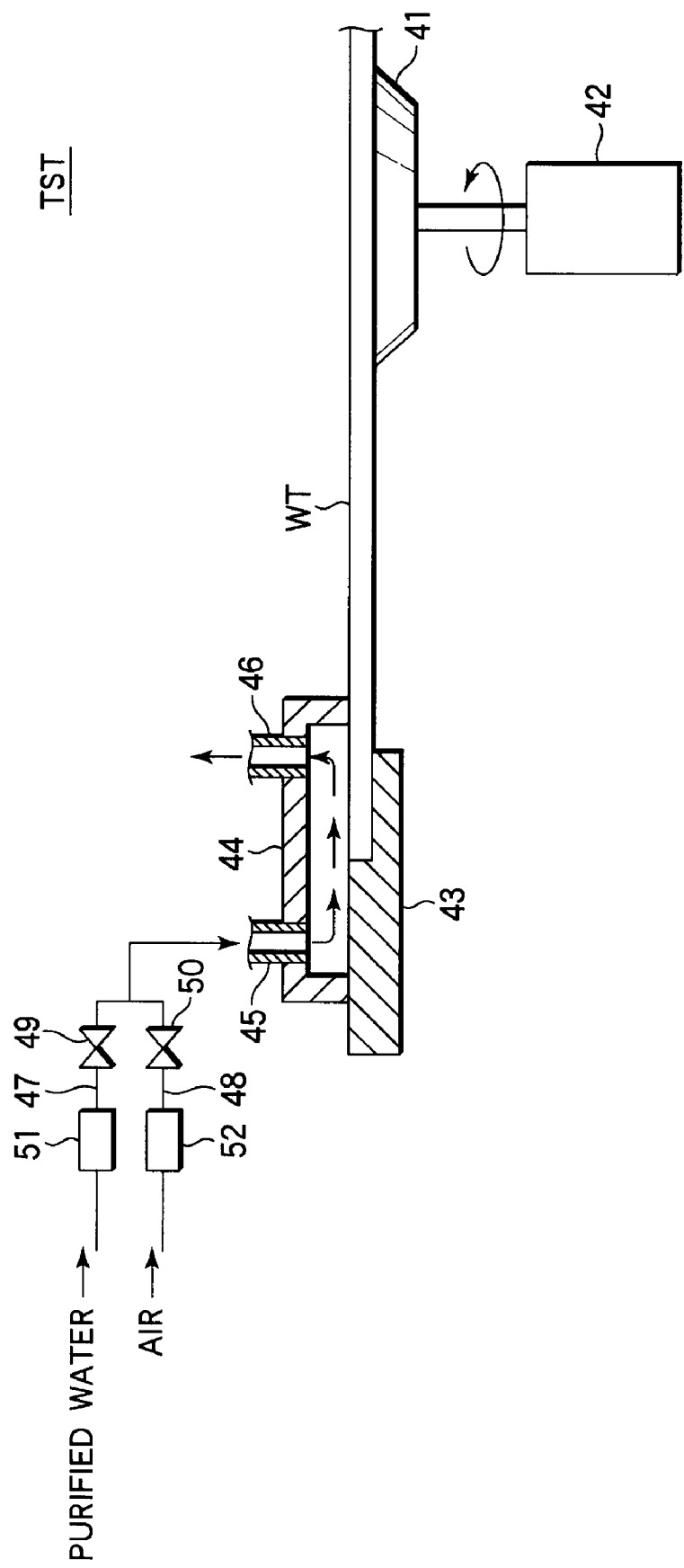
FIG. 7 is a sectional view showing an example of a testing unit used in the pattern forming apparatus.
Figure 8:
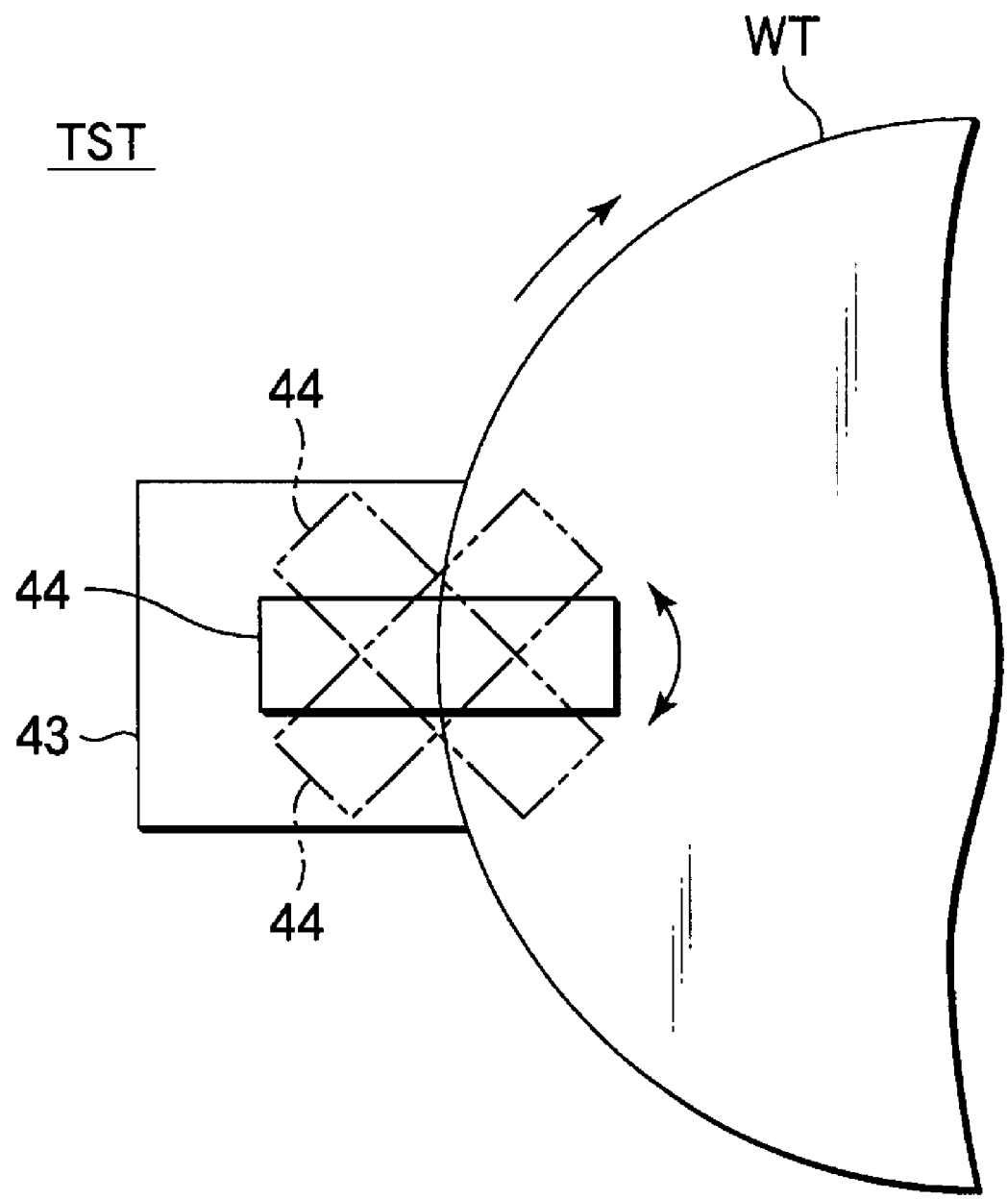
FIG. 8 is a plan view of the testing unit shown in FIG. 7.

FIG. 7 is a sectional view showing an example of the testing unit (TST). FIG. 8 is a plan view of the testing unit (TST). The testing unit (TST) includes a spin chuck 41 disposed inside a casing (not shown) and configured to hold a test wafer WT by a vacuum attraction force and to horizontally rotate the wafer W by a rotary motor 42. A wafer guide 43 is disposed to correspond to the edge portion of the test wafer WT held by the spin chuck 41 and to provide a surface flash with the front surface of the wafer WT. A testing nozzle 44 is disposed to cover adjacent parts of the wafer guide 43 and wafer. The upper side of the testing nozzle 44 is provided with a fluid supply pipe 45 and a fluid discharge pipe 46 located on an outer side and an inner side, respectively. The fluid supply pipe 45 is connected to a purified water line 47 and an air line 48. The purified water line 47 and air line 48 are respectively provided with valves 49 and 50 to selectively supply purified water and air to the testing nozzle 44.

Further, flow rate controllers 51 and 52 are disposed to control the flow rates of purified water and air, respectively, which are selectively supplied to flow inside the testing nozzle 44 from the wafer guide 43 side toward the test wafer WT. As shown in FIG. 8, the testing nozzle 44 is pivotable in a horizontal plane by a pivot driving mechanism (not shown) to adjust the angle of a flow of purified water or air hitting the edge portion of the test wafer WT. Since the flow rates of purified water and air inside the testing nozzle 44 are adjustable and the angle of the testing nozzle 44 is adjustable, various conditions of immersion light exposure can be imitated. Accordingly, it is possible to examine the state of film peeling to be caused on a wafer W under given light exposure conditions.

Figure 9:
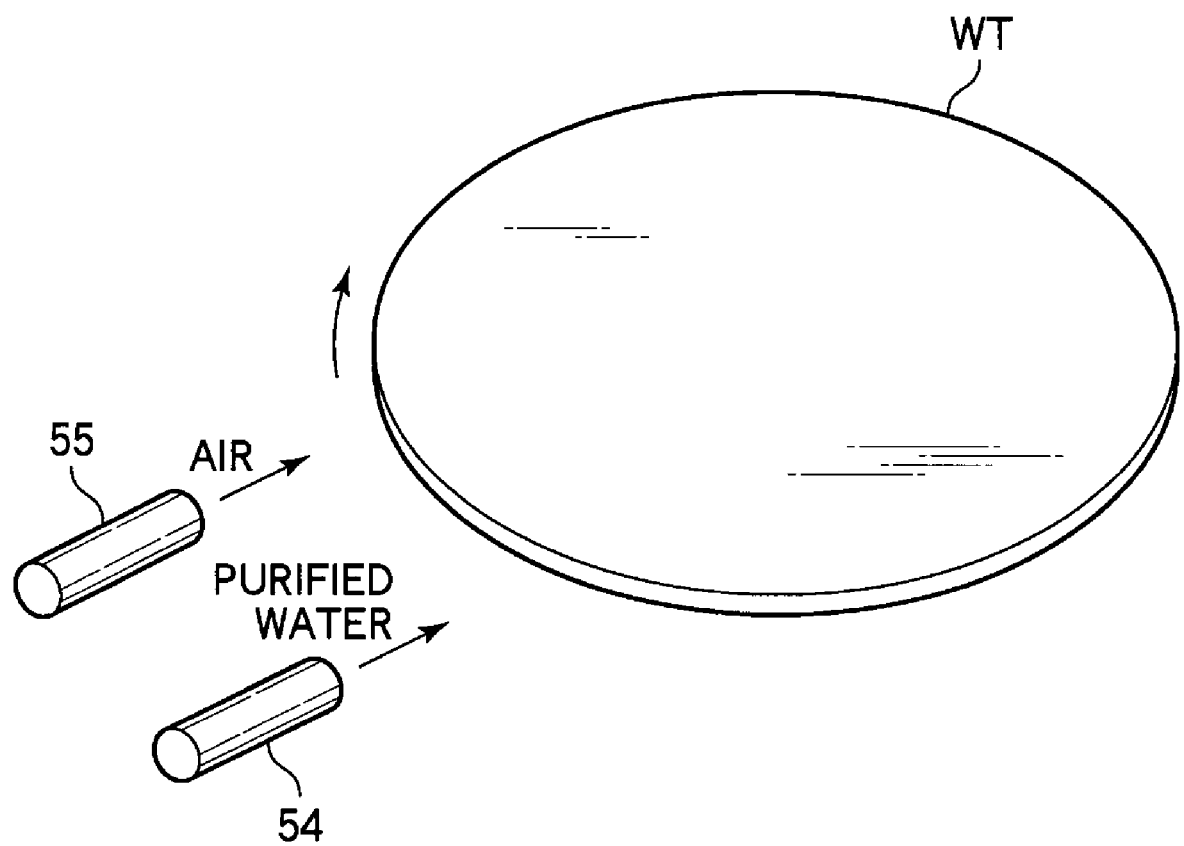
FIG. 9 is a perspective view showing another example of a testing unit used in the pattern forming apparatus.

FIG. 9 is a perspective view showing another example of the testing unit (TST). In this example, a purified water nozzle 54 and an air nozzle 55 are disposed to correspond to the edge portion of a test wafer WT and to selectively spout purified water and air toward the edge portion of the test wafer WT. The nozzles are further provided with mechanisms to adjust the spouting speeds and directions of the fluids from the nozzles.

The examination unit 19 is used to examine the state of the edge portion of each test wafer WT after a film peeling test is performed in the testing unit (TST). The examination unit 19 is configured to examine the edge portion of a film by an optical method. For example, a scanning electron microscope (SEM) is used to pick up an image of the edge portion.

Figure 10:
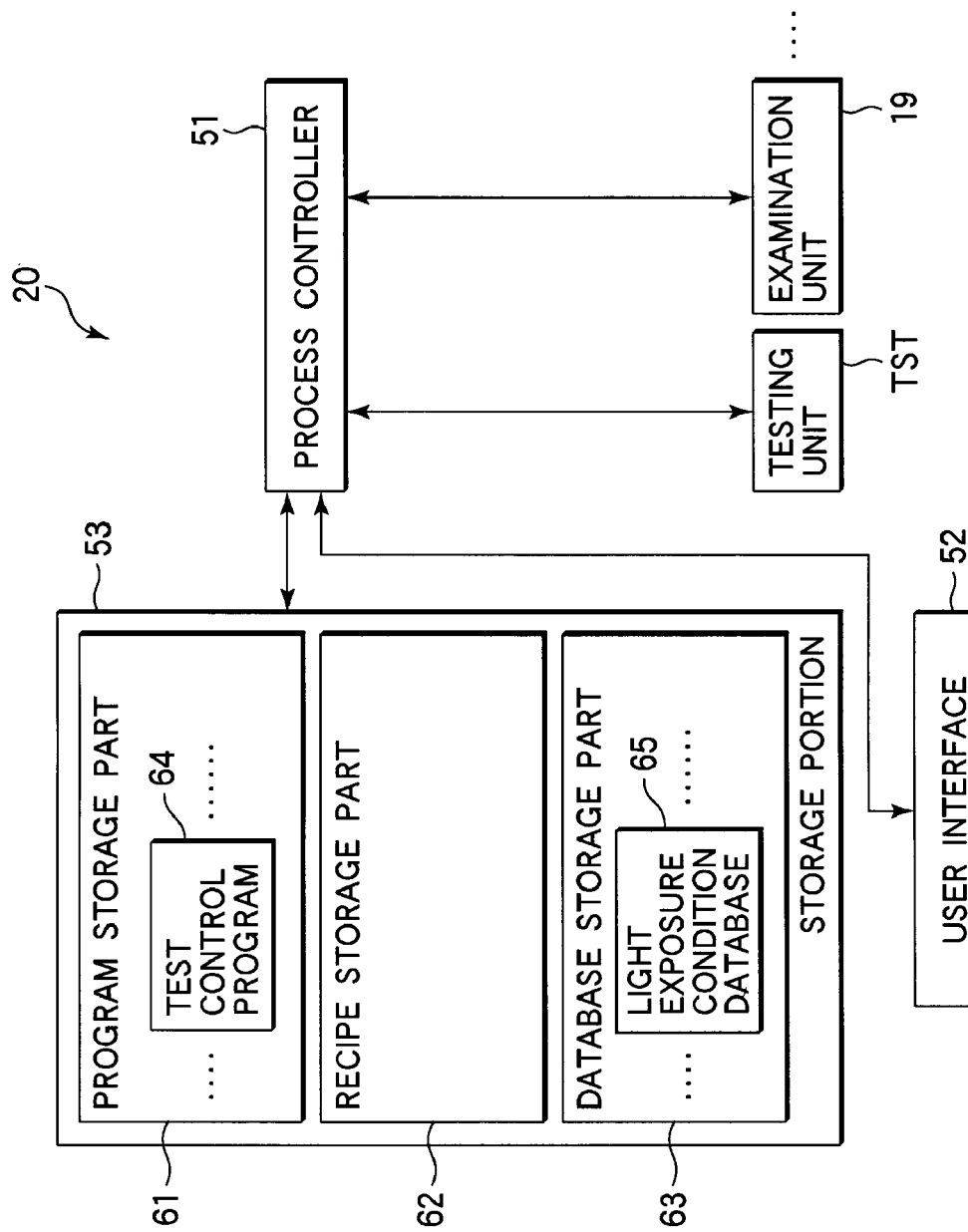
FIG. 10 is a block diagram showing a main part of a central control section used in the pattern forming apparatus.
Figure 11A:
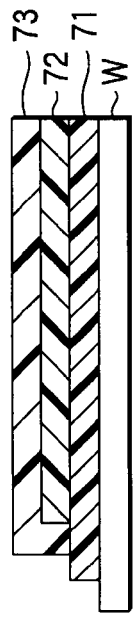
FIGS. 11A to 11F are sectional views each for explaining a structure of a film formed on a wafer after an edge process.
Figure 11B:
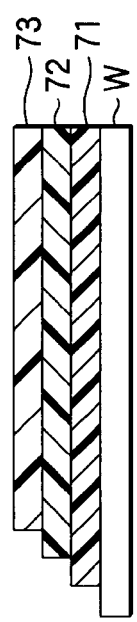
Figure 11C:
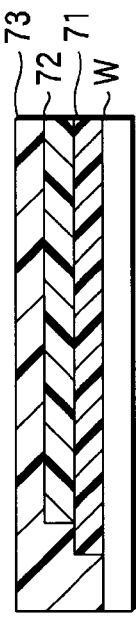
Figure 11D:
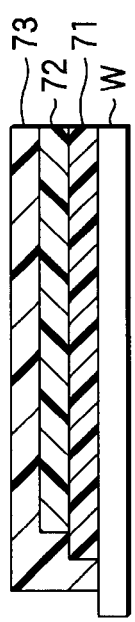
Figure 11E:
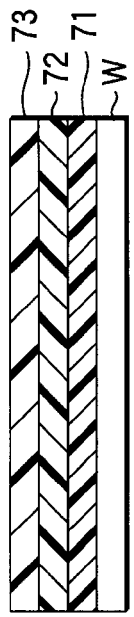
Figure 11F:
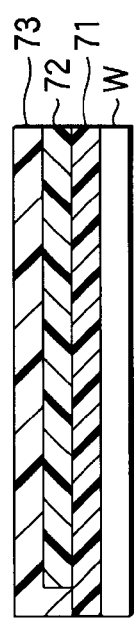

Next, an explanation will be given of a central control section 20. FIG. 10 is a block diagram showing a main part of the central control section. The central control section 20 includes a process controller 51 comprising a microprocessor (MPU) for controlling the respective components included in the pattern forming apparatus 1, such as the processing units and transfer mechanisms. The central control section 20 further includes a user interface 52, which comprises, e.g., a keyboard and a display, wherein the keyboard is used for a process operator to input commands for operating the respective components in the pattern forming apparatus 1, and the display is used for showing visualized images of the operational status of the respective components in the pattern forming apparatus 1. The central control section 20 further includes a storage portion 53 that stores data necessary for processes.

The storage portion 53 includes a program storage part 61, a recipe storage part 62, and a database storage part 63. The program storage part 61 stores various control programs for realizing various processes performed in the pattern forming apparatus 1 under the control of the process controller 51. The recipe storage part 62 stores recipes with process condition data and process sequences recorded therein. The database storage part 63 stores databases necessary for processes.

When a process is performed, a required recipe is retrieved from the recipe storage part 62 of the storage portion 53 and executed by the process controller 51 in accordance with an instruction or the like input through the user interface 52. Consequently, each of various predetermined processes is performed in the pattern forming apparatus 1 under the control of the process controller 51. The recipe storage part 62 may be formed of a computer readable storage medium, such as a CD-ROM, hard disk, flexible disk, or nonvolatile memory. Further, a recipe may be utilized on-line, while it is transmitted from a suitable apparatus through, e.g., a dedicated line, as needed.

The pattern forming apparatus 1 is used not only to perform a pattern forming process on product wafers (process targets) but also to perform film peeling test processes, which imitate conditions of immersion light exposure, on test wafers (test targets). On the basis of results obtained by the test processes, the conditions of a coating process are determined so that no film peeling occurs. The central control section 20 takes on control for these test processes.

An explanation will be given of matters of the central control section 20 in relation to control for the tests. Specifically, the program storage part 61 stores film peeling test control programs 64 for controlling film peeling tests performed in the testing unit (TST), examination performed in the examination unit 19, and condition change performed on the basis of results obtained by the examination. The immersion light exposure section 30 is operated in accordance with various specifications as described above, and the immersion head is moved at different scanning speeds depending on the designated throughput. Accordingly, the database storage part 63 stores, as a part of various databases, a light exposure condition database 65 prepared as a library containing the specifications of immersion light exposure sections and conditions for respective throughputs used in various light exposure apparatuses. The recipe storage part 62 stores various recipes for coating the anti-reflective coating (BARC), resist film, and protection film (top coating film). Of them, the conditions of edge processes performed on these coating films are most important to control film peeling, and suitable conditions are selected from these conditions of edge processes to prevent film peeling.

For example, the recipe storage part 62 stores the recipes of processes including six types shown in FIGS. 11A to 11F as specific examples for forming the anti-reflective coating (BARC), resist film, and protection film. In the type shown in FIG. 11A, all of the anti-reflective coating (BARC) 71, resist film 72, protection film (top coating film) 73 formed on a wafer W are subjected to edge processes. The edge processes are respectively performed during the coating processes of the films each by supplying a solvent, such as thinner, onto the edge of the film. In the type shown in FIG. 11B, the protection film (top coating film) 73 is subjected to an edge process that is stopped when the anti-reflective coating (BARC) 71 is exposed. In this case, the edge portion of the protection film (top coating film) 73 is present on the anti-reflective coating (BARC) 71 with good adhesiveness and thus can hardly cause peeling. In the type shown in FIG. 11C, the protection film (top coating film) 73 is subjected to an edge process that is stopped before the anti-reflective coating (BARC) 71 is exposed. In this case, the edge portion of the protection film (top coating film) 73 is present on the wafer W and thus can easily cause peeling, so an adhesion process is required. In the type shown in FIG. 11D, the protection film (top coating film) 73 is subjected to no edge process. In this case, the edge portion of the protection film (top coating film) 73 is present on the wafer W and thus can easily cause peeling, so an adhesion process is required, as in the type shown in FIG. 11C. In the type shown in FIG. 11E, only the resist film 72 is subjected to an edge process. In the type shown in FIG. 11F, all the films are subjected to no edge processes. In the last two cases, although a good film peeling resistance is provided, the guide of a main wafer transfer arm may be contaminated and fallen organic matters may generate particles.

The examination unit 19 is electrically connected to the process controller 51 of the central control section 20, so that the result of examination performed on each test wafer in the examination unit 19 is input into the process controller 51 to judge whether or not the film state is within an allowable range. If it is out of the allowable range, another test wafer with films formed under different conditions is prepared. This test wafer is subjected to the same test, and the film state is examined by the examination unit 19 and judged. The operations described above are repeated until good conditions for preventing film peeling are found. The conditions thus found are used to perform the coating processes for product wafers.

In this case, as described above, since the edge state of each film is most important, it is preferable to mainly control the edge processes described above to prevent film peeling. In general, the manners of edge processes are designated by users, but include flexibility to some extent. Accordingly, a test wafer is prepared by use of edge processes under designated conditions, and is then tested, as described above. If film peeling occurs by this test, the edge process manners are changed, or the edge process conditions for each film are changed, e.g., a process width is controlled, to improve the film peeling resistance.

Figure 12:
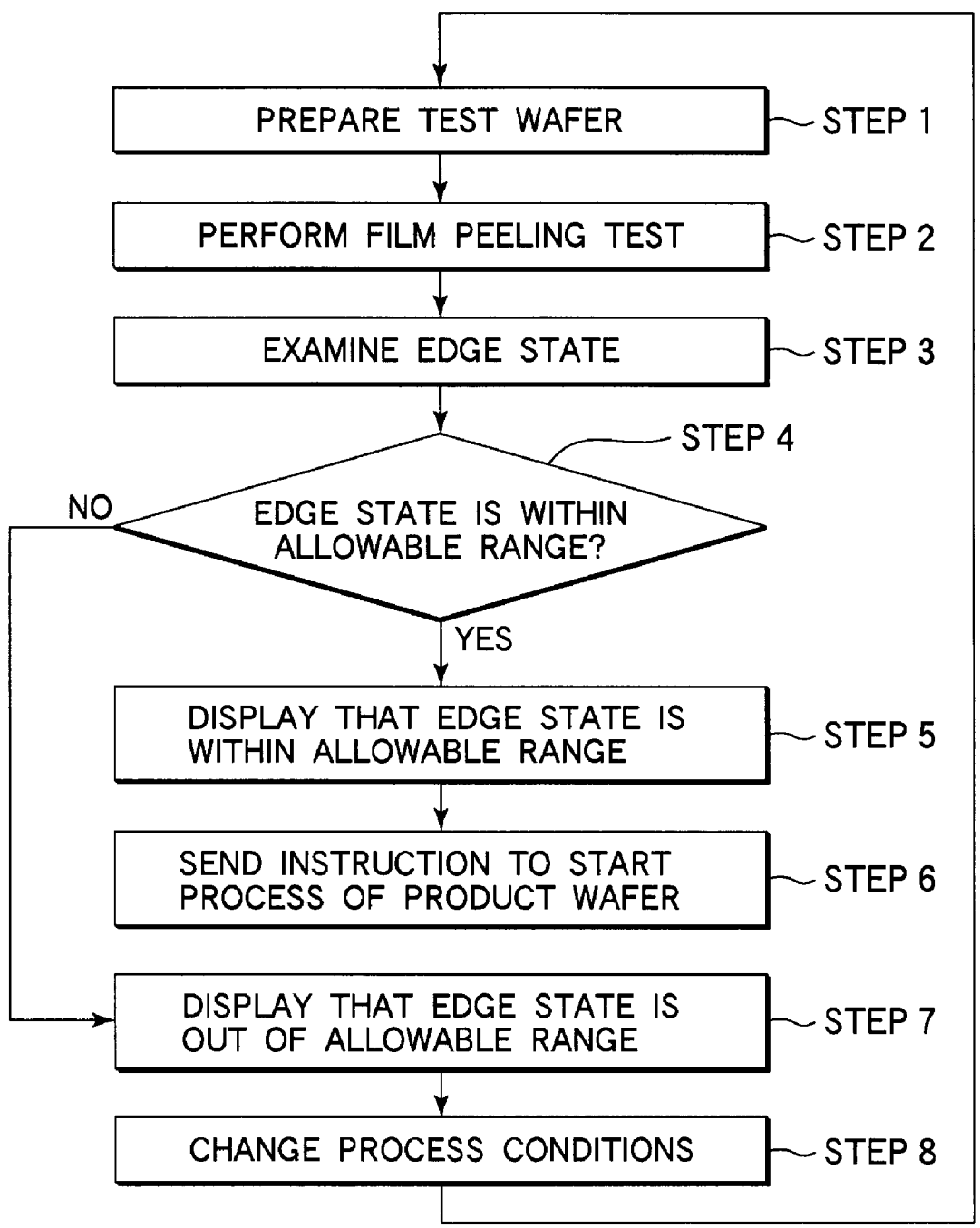
FIG. 12 is a flow chart showing a process condition determining method for a wafer with a coating film to be subjected to immersion light exposure, according to this embodiment.

FIG. 12 is a flow chart showing a process condition determining method for a wafer with a coating film to be subjected to immersion light exposure, according to this embodiment. An explanation will be given of operations concerning a process condition determining method, i.e., a test performed by the testing unit (TST), which imitates the immersion light exposure apparatus, and processes performed thereafter.

At first, in accordance with the sequence used for product wafers and under the standard conditions (designated conditions), an anti-reflective coating (BARC), a resist film, and a protection film (top coating film) are formed and subjected to predetermined edge processes, so as to prepare a test wafer (test target) (STEP 1). Specifically, the test target includes a sample substrate corresponding to a substrate of a product wafer W (process target) and a sample film corresponding to a product coating film. The sample film is formed of a laminated structure of the anti-reflective coating, resist film, and protection film.

Then, the test wafer is transferred to the testing unit (TST), in which a film peeling test is performed while conditions, such as the angle of the testing nozzle 44, the flow rate of purified water, and the flow rate of air, are set to imitate conditions used in the immersion light exposure section 30 of the light exposure apparatus 14 (STEP 2).

After this test, the test wafer is transferred to the examination unit 19, in which examination is performed on the state of the edge portion of the test wafer (the edge portion of the sample film) by, e.g., an optical method (STEP 3). For example, a scanning electron microscope (SEM) is used to pick up an image of the edge portion of the test wafer at a suitable magnification.

Then, the examination result is transmitted to the process controller 51, and is judged whether or not the edge state is within an allowable range (STEP 4). If the edge state is within the allowable range, the edge process conditions used for this test wafer are determined as edge process conditions for product wafers, while the display of the user interface 52 is set to display that edge state is within the allowable range (STEP 5). Then, an operator can send an instruction to start a process of product wafers through the keyboard of the user interface 52 to the process controller 51 (STEP 6).

On the other hand, if the edge state is out of the allowable range, the display of the user interface 52 is set to display that edge state is out of the allowable range (STEP 7). Then, an operator can change process conditions, such as film formation conditions, through the keyboard of the user interface 52 (STEP 8). To be more precise, a recipe is altered in conditions, such as coating conditions used for forming films on a test wafer and/or edge process conditions used for the films thus formed, or an edge process recipe itself is replaced with another one. Then, a test wafer is prepared by use of the coating film conditions thus changed, and is subjected to the film peeling test of STEP 2, the examination of STEP 3, and the judgment of STEP 4 on the edge state. These operations are repeated until the edge state comes into the allowable range. When the edge state comes into the allowable range, the operations of STEPS 5 and 6 are performed.

As described above, the testing unit (TST) is used to perform tests, which imitate conditions of immersion light exposure, on test wafers with films formed thereon to correspond to product wafers. On the basis of results of the tests, conditions for preventing film peeling are determined, so as to prevent a product wafer actually processed in a light exposure machine from causing film peeling.

The present invention is not limited to the embodiment described above, and it may be modified in various manners. For example, in the embodiment described above, the testing unit (TST) is located inside the process station, but the testing unit (TST) may be located inside the cassette station or interface station. The testing unit (TST) and the examination unit 19 are built in the pattern forming apparatus 1, but the testing unit (TST) and the examination unit 19 may be located outside the pattern forming apparatus 1 and configured to feed back test results to the pattern forming apparatus 1. Only the testing unit (TST) may be built in the pattern forming apparatus 1 to perform film peeling tests on test wafers with films formed under predetermined conditions, while an examination unit may be located outside the pattern forming apparatus 1 to perform examination on the test wafers, thereafter. Where an examination unit is located outside the pattern forming apparatus, it may be arranged such that an operator examines the edge state of a film formed on a wafer by use of an optical microscope, and judges whether or not the edge state is within an allowable range.

In the embodiment described above, the display is set to display examination results obtained by the examination unit, so that an operator can operate the apparatus. Alternatively, it may be arranged such that, on the basis of examination results, if the film state is within an allowable range, coating processes for product wafers are automatically started, while, if the film state is out of the allowable range, a subsequent set of conditions are automatically used to perform a subsequent film peeling test.

In the embodiment described above, a library containing various immersion light exposure conditions is prepared as a database. Alternatively, it may be arranged such that, immersion light exposure conditions to be considered are input when each set of tests is to be performed in the testing unit. Further, in the embodiment described, the edge process manners for films formed on a wafer are mere examples, and thus other edge processes may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A process condition determining method for determining a condition of an edge process performed on an edge portion of a coating film formed in a process target, the method comprising:
   preparing a test target, which comprises a sample film corresponding to the coating film and subjected to the edge process under a certain condition;
   performing a test process on the test target in a testing unit, which imitates an immersion light exposure apparatus, under a condition corresponding to a designated immersion light exposure condition;
   performing examination on a state of an edge portion of the sample film after the test process;
   performing judgment as to whether or not the state of the edge portion of the sample film is within an allowable range, based on a result of the examination;
   in response to a case where the state of the edge portion of the sample film is out of the allowable range, performing the test process, the examination, and the judgment on another test target prepared by use of a different condition of the edge process; and
   in response to a case where the state of the edge portion of the sample film is within the allowable range, determining a condition of the edge process to be used for the process target, based on the condition of the edge process used for preparing this test target.

2. The process condition determining method according to claim 1, wherein each of the coating film and the sample film comprises an anti-reflective coating, a resist film, and a protection film laminated in this order from below.

3. The process condition determining method according to claim 1, wherein the examination comprises examining the state of the edge portion of the sample film by an optical method.

4. The process condition determining method according to claim 1, wherein the condition corresponding to the designated immersion light exposure condition is selected from a database comprising a library containing various conditions.

5. A process condition determining system for determining a condition of an edge process performed on an edge portion of a coating film formed in a process target, the system comprising:
   a testing unit configured to imitate an immersion light exposure apparatus and to perform a test process, under a condition corresponding to a designated immersion light exposure condition, on a test target, which comprises a sample film corresponding to the coating film subjected to the edge process under a certain condition;
   an examination unit configured to perform examination on a state of an edge portion of the sample film after the test process; and
   a control section configured to
   perform judgment as to whether or not the state of the edge portion of the sample film is within an allowable range, based on a result of the examination;
   in response to a case where the state of the edge portion of the sample film is out of the allowable range, performing the test process, the examination, and the judgment on another test target prepared by use of a different condition of the edge process; and
   in response to a case where the state of the edge portion of the sample film is within the allowable range, determining a condition of the edge process to be used for the process target, based on the condition of the edge process used for preparing this test target.

6. The process condition determining system according to claim 5, wherein the examination unit is configured to examine a state of the sample film by an optical method.

7. The process condition determining system according to claim 5, wherein the control section includes a database comprising a library containing various immersion light exposure conditions and is configured to select the condition corresponding to the designated immersion light exposure condition from the database.

8. A computer readable storage medium that stores a control program for execution on a computer, the control program, when executed, causing the computer to control a system to conduct a process condition determining method for determining a condition of an edge process performed on an edge portion of a coating film formed in a process target, the method comprising:
   performing a test process on the test target, which comprises a sample film corresponding to the coating film subjected to the edge process under a certain condition, in a testing unit, which imitates an immersion light exposure apparatus, under a condition corresponding to a designated immersion light exposure condition;
   performing examination on a state of an edge portion of the sample film after the test process;
   performing judgment as to whether or not the state of the edge portion of the sample film is within an allowable range, based on a result of the examination;
   in response to a case where the state of the edge portion of the sample film is out of the allowable range, performing the test process, the examination, and the judgment on another test target prepared by use of a different condition of the edge process; and
   in response to a case where the state of the edge portion of the sample film is within the allowable range, determining a condition of the edge process to be used for the process target, based on the condition of the edge process used for preparing this test target.

9. The computer readable storage medium according to claim 8, wherein the condition corresponding to the designated immersion light exposure condition is selected from a database comprising a library containing various conditions.

* * * * *